United States Patent [19]

Levine et al.

[11] 4,191,895

[45] Mar. 4, 1980

[54] LOW NOISE CCD INPUT CIRCUIT

[75] Inventors: Peter A. Levine, Trenton; Donald J. Sauer, Plainsboro, both of N.J.

[73] Assignee: RCA Corporation, New York, N.Y.

[21] Appl. No.: 708,351

[22] Filed: Jul. 26, 1976

[51] Int. Cl.$^2$ ................... G11C 19/28; H01L 29/78
[52] U.S. Cl. ............................... 307/221 D; 357/24
[58] Field of Search .................. 357/24; 307/221 D

[56] References Cited

U.S. PATENT DOCUMENTS

| | | | |
|---|---|---|---|
| 3,789,267 | 1/1974 | Krambeck et al. | 357/24 |
| 3,858,232 | 12/1974 | Boyle et al. | 357/24 |
| 3,866,067 | 2/1975 | Amelio | 357/24 |
| 3,986,198 | 10/1976 | Kosonocky | 357/24 |

OTHER PUBLICATIONS

Sequin "Linearity of Electrical Charge Injection into Charge-Coupled Devices", IEEE J. Solid-State Circuits, vol. SC-10 (4/75), pp. 81-92.

*Primary Examiner*—Gene M. Munson
*Attorney, Agent, or Firm*—H. Christoffersen; Samuel Cohen

[57] ABSTRACT

A "fill and spill" charge coupled device (CCD) input circuit which includes a drain region separated from the input storage region by a potential barrier. The barrier height is held at a level at least as high as that of the potential barrier beneath the first gate electrode and lower than that of the first transfer electrode to insure that carriers injected by the source electrode during the fill operation which might otherwise flow down the CCD channel pass instead to the drain region.

11 Claims, 3 Drawing Figures

LOW NOISE CCD INPUT CIRCUIT

The present application relates to charge coupled device (CCD) input circuits and particularly to those of the "fill and spill" type.

Figure 1:
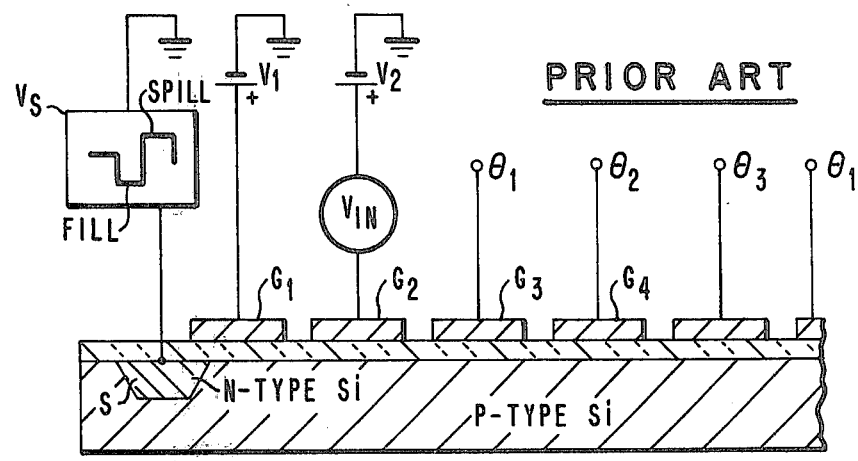
FIG. 1 is a schematic showing of a known CCD input circuit.

Copending U.S. application Ser. No. 565,563, filed Apr. 7, 1975, now issued as U.S. Pat. No. 3,986,198 which is a continuation of U.S. application Ser. No. 369,580, filed June 13, 1973, by Walter F. Kosonocky for "Introducing Signal at Low Noise Level to Charge Coupled Circuit" and assigned to the same assignee as the present application, describes relatively noise-free circuits for introducing a charge signal into a CCD register. FIG. 1 of the present application illustrates a typical such circuit. It includes an input region S of the CCD, which may be a diffusion of opposite conductivity than the substrate, and a plurality of electrodes including $G_1-G_4$. Gate electrode $G_1$ is held at a voltage $+V_1$ to create a shallow potential well-- which operates here as a potential barrier ($W_1$ of FIG. 2) beneath electrode $G_1$. A voltage applied to storage electrode $G_2$ creates a deeper potential well beneath this electrode than beneath $G_1$. This voltage may include a bias component $+V_2$ and a signal component $V_{IN}$, where $V_{IN}$ is effectively applied between electrodes $G_1$ and $G_2$. Transfer electrode $G_3$ is held at a voltage $\phi_1$ which is less positive than $V_1$ during the fill and spill operation. Thus the barrier $W_3$ beneath $G_3$ is higher than barrier $W_1$ beneath $G_1$.

During the "fill" portion of the operation, region S is pulsed relatively negatively and operates as a source of charge carriers. In one example of CCD illustrated, which is a surface channel CCD, the substrate is of P-type and the diffusion S is of N type so that the carriers are electrons. The electrons pass over the potential barrier $W_1$ (FIG. 2, Row 1) beneath gate electrode $G_1$ and fill the potential well beneath the storage electrode $G_2$ to a level proportional to the difference in potential between that of region S and the surface potential beneath electrode $G_2$. The latter potential, in turn, is a function of the voltage applied to electrode $G_2$. The potential barrier $W_3$ prevents any of the charge signal from flowing down the CCD register.

Figure 2:
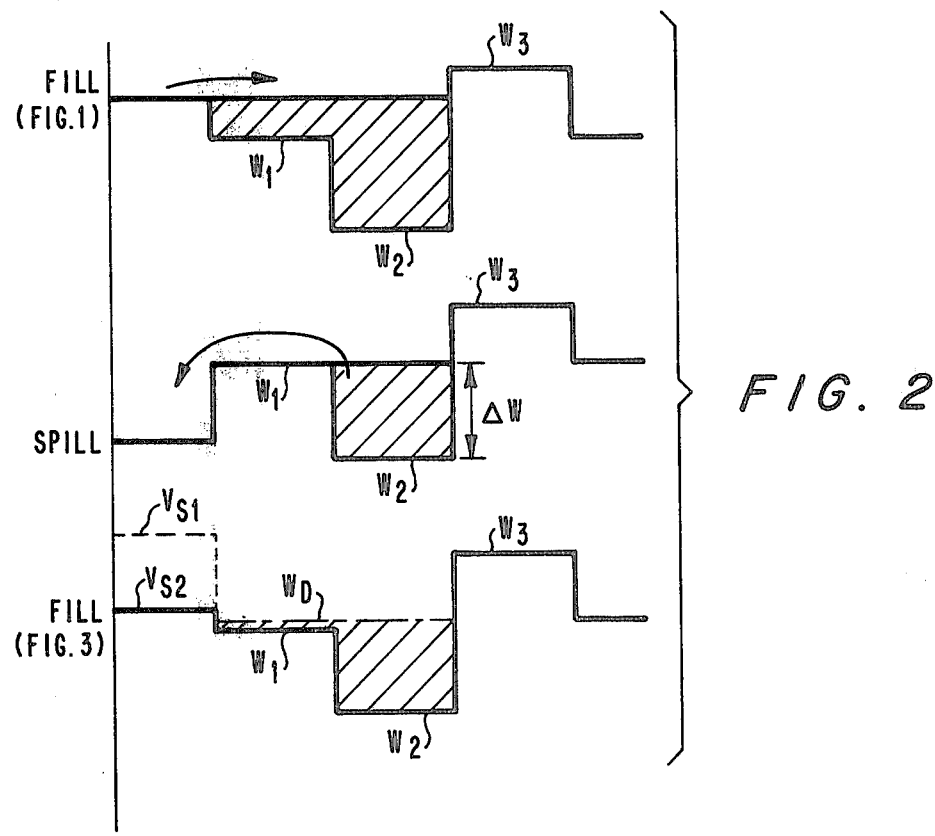
FIG. 2 is a drawing of surface potentials to help explain the operation of the circuits of FIGS. 1 and 3.

After the filling operation, the potential of the source S is made relatively more positive to cause region S to operate as a drain for charge carriers. This occurs during the time the input signal $V_{IN}$ is present. The excess charge in the potential well now spills back over the first potential barrier $W_1$ to the drain S, and there remains in the potential well a charge which has a component proportional to the input signal $V_{IN}$ and which also has a dc component proportional to $V_2-V_1$ (in the limiting case, $V_2-V_1$ may equal zero). This charge is represented in FIG. 2 (Row 2) as a difference in surface potentials $\Delta W$ between the regions of the substrate beneath electrodes $G_1$ and $G_2$, respectively.

It is important in the fill and spill operation described above that the potential of the input diffusion S during the fill operation be between the two limits $W_1$ and $W_3$. It must be greater than surface potential $W_1$ to insure that charge carriers (electrons) pass over the barrier $W_1$ and fill the first potential well. However, it must be less than surface potential $W_3$ to prevent electrons from flowing over the barrier $W_3$ and down the CCD channel. The present application relates to a circuit for insuring such operation.

Figure 3:
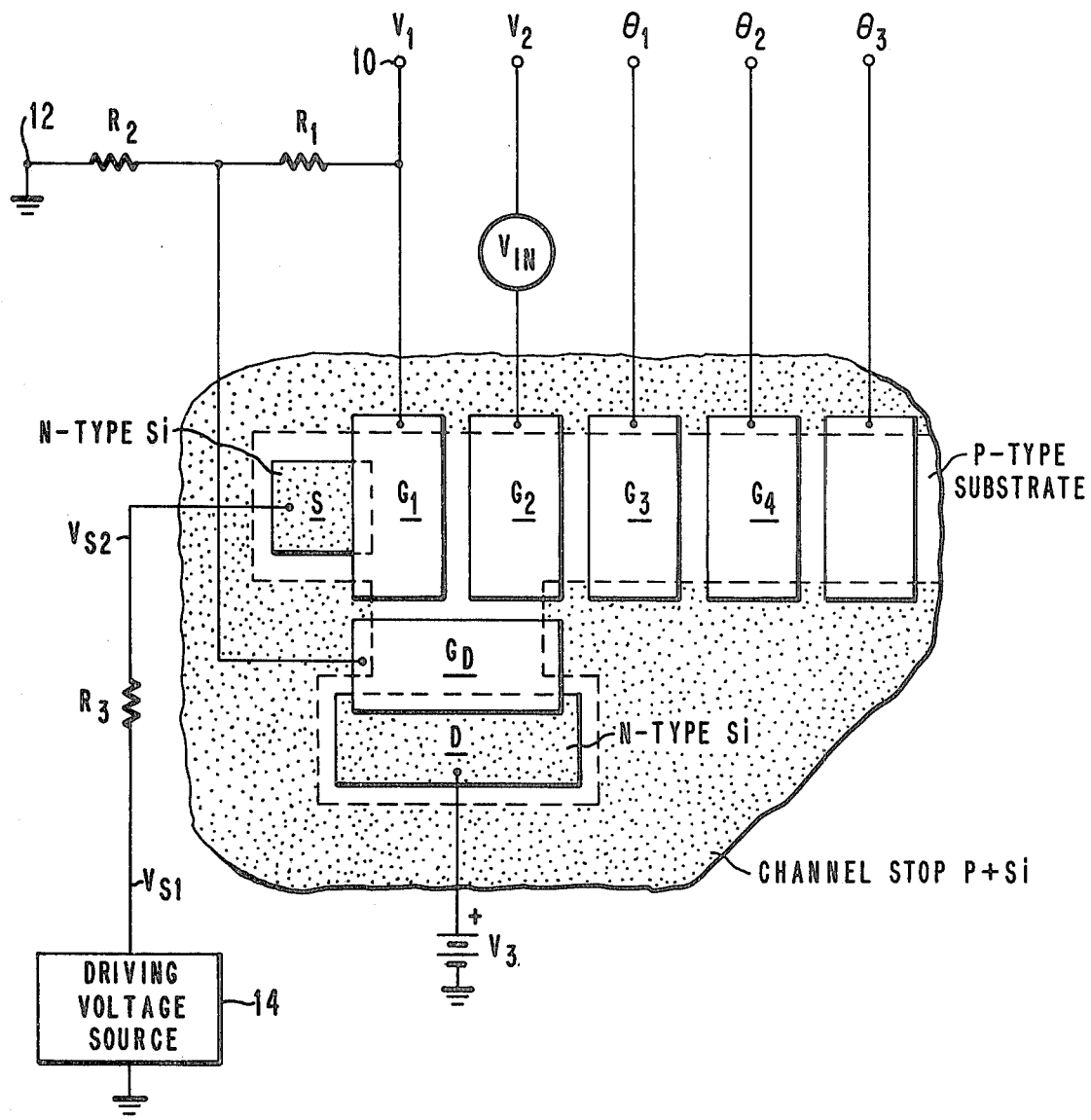
FIG. 3 is a top view of a CCD input circuit embodying the present invention.

FIG. 3 illustrates an embodiment of the invention. The input diffusion S and the electrodes $G_1-G_4$ are similar to those shown in FIG. 1. The circuit also includes a drain region D, such as a diffusion of opposite conductivity than the substrate, and a gate electrode $G_D$ which overlaps, at one edge, an edge of the drain diffusion D and which extends between the drain diffusion and the electrodes $G_1$ and $G_2$. The voltage for electrode $G_D$ is taken from the tap of a voltage divider $R_1$, $R_2$, the divider being connected between the terminal 10 for voltage $V_1$ and circuit point 12 which is at a reference level, shown here as ground. Resistor $R_2$ may have a value, for example, nine times larger than that of resistor $R_1$, so that the dc level of gate $G_D$ may be 0.9 that of electrode $G_1$. Thus, the potential barrier beneath electrode $G_1$ will be slightly lower than the potential barrier beneath electrode $G_D$. The multiple phase voltage $\phi_1$ is less positive than the voltage on gate electrode $G_D$ during the fill-and-spill operation so that the potential barrier $W_3$ is higher than the potential barrier $W_D$ beneath gate $G_D$. The drain region D is held at a positive voltage level $V_3$ by a dc source, shown as a battery.

In the operation of the circuit of FIG. 3, the driving voltage source 14 generates a relatively negative voltage $V_{S1}$ during the fill operation. This relatively negative voltage, in practice, can be a positive voltage level close in value to the substrate potential, which can be assumed to be at ground. Driver 14 is coupled to the source electrode S via resistor $R_3$ and supplies a voltage to electrode S at a level which insures that electrons flow from the source S, over the barrier $W_1$ (FIG. 2) beneath the input gate electrode $G_1$ to the potential well $W_2$. If a level $V_{S1}$ this low were used in the prior art circuit of FIG. 1, great care would have to be taken to insure that the source potential $V_{S2}$ never became more negative than (actually less positive than) the surface potential $W_3$ during the fill operation. If it did, electrons from the source S could pass over the barrier $W_3$ and flow down the channel and would appear as noise when the CCD later were read out.

In the circuit of the present application, the potential barrier $W_D$, (illustrated by a dot-dash line in the last surface potential profile of FIG. 2) beneath gate electrode $G_D$ is lower than the potential barrier $W_3$ beneath electrode $G_3$ and higher than the barrier $W_1$. Accordingly, even if the potential $V_{S1}$ supplied by driver 14 attempts to drive the diffusion S less positive than $W_D$, as illustrated by dashed line legended $V_{S1}$ in FIG. 2, the potential well beneath storage electrode $G_2$ will not become filled to greater than the level $W_D$. The barrier $W_D$ effectively clamps the level to which this potential well can be filled. Any electrons which attempt to fill the potential well to a level greater than $W_D$ will pass over the potential barrier $W_D$ beneath gate electrode $G_D$ to the drain diffusion D (in preference to flowing over the higher barrier $W_3$) and be conducted away. Put another way, the potential barrier $W_D$ tends to clamp the source S to a value $V_{S2}$ only slightly more negative than the surface potential $W_D$. When the source electrode voltage $V_{S2}$ attempts to exceed this level, the electrons tending to make $V_{S2}$ more negative flow over the barriers $W_1$ and $W_D$ to the drain D. In effect, $R_3$ in series with the conduction paths beneath electrodes $G_1$ and $G_D$ form a voltage divider and clamp the source electrode to a level $V_{S2}$ only slightly more negative than $W_D$ (and more positive than $W_3$).

The spill operation in the circuit of FIG. 13 is the same as already discussed in connection with FIG. 1. It occurs when the driving voltage source 14 applies a relatively positive voltage to source electrode S immediately following the fill operation. Thereafter, the charge $\Delta W$ (FIG. 2) stored in the potential well beneath electrode $G_2$ is propagated down the CCD register to appropriate adjustment of the multiple phase voltage $\phi_1 - \phi_3$, in conventional fashion.

Resister $R_3$ in series with the driving voltage source limits the current applied to the input diffusion S to a level such that any excess current which overflows the potential well beneath storage electrode $G_2$ can be "sinked" by the drain diffusion D. In a P substrate surface channel device with a driving voltage source 14 which produces an output voltage which swings between 0 and +10 volts, resistor $R_3$ may have a value of the order of tens of kilohms and the source 14 plus resistor $R_3$ can be considered a current source. The circuit also includes "channel stop" regions, shown as P+ regions of higher impurity concentration than the substrate, for confining the flow of charge signals to the desired signal paths. An important feature of the circuit of FIG. 3 is that the dc bias potential applied to electrode $G_D$ is related to the dc bias potential $V_1$ applied to electrode $G_1$. Thus, if the potential $V_1$ applied to terminal 10 should drift, then the dc potential applied to electrode $G_D$ will drift in the same sense and the ratio between barrier potential levels $W_D$ and $W_1$ will remain substantially constant. These barrier potentials also tend to track one another in response to other changes such as those due to aging and changes in ambient conditions such as temperature and the like.

While the invention has been illustrated in terms of a surface channel CCD employing a P type substrate, it is of course to be understood that an N type substrate can be employed instead with P type regions for S and D, respectively. It is also to be understood that the teachings of the present application are applicable to buried channel CCD's as well as surface channel CCD's and to two, four and other numbers of phases rather than the three-phase system given by way of example. Further, while the resistors $R_1-R_3$ are illustrated in schematic form, in practice, it is preferred that they be integrated onto the same substrate as the remainder of the CCD. These resistors can be doped regions of semiconductor or can be, as a second example, MOS transistors, each such transistor connected gate electrode-to-drain electrode. The voltage divider can be two such transistors connected in series with the geometry (conduction path length and width) such that the transistors exhibit the desired resistance ratio. As another alternative, an emitter follower circuit may be substituted for the voltage divider.

In some applications the circuit can be simplified by omitting the voltage divider $R_1$, $R_2$ entirely and using a single electrode for $G_1$ and $G_D$ or a conductive connection between the two. Here the potential barriers $W_1$ and $W_D$ would be of the same height. Current supplied by the source S during the fill operation now would flow in parallel both to the potential well beneath electrode $G_2$ and to the drain. However, as soon as the well beneath electrode $G_2$ fills to a level slightly above $W_1$, the excess charge flows to the drain rather than flowing over the barrier $W_3$.

What is claimed is:

1. A method of operating a CCD in which an input potential well initially is filled by introducing charge therein from a source of charge carriers over a potential barrier, and then some of the charge in the well is spilled out of the well to leave remaining in the well an amount of charge which is a function of a signal potential between the electrode employed to form the barrier and the electrode employed to form the well, comprising the step of:

removing from the well during the filling thereof any carriers which attempt to fill the well to a level greater by more than a substantially fixed percentage, than the height of said potential barrier.

2. A CCD input electrode structure comprising, in combination:

a semiconductor substrate of one conductivity type;

a first region in the substrate of a conductivity opposite to that of the substrate;

first, second and third electrodes insulated from the substrate, said second electrode comprising a storage electrode, said first electrode located between said storage electrode and said first region and operating as a gate electrode, and said third electrode adjacent to said second electrode;

means for applying a bias voltage to said first electrode for forming a first potential barrier in said substrate;

means including means for applying an input signal voltage between said first and second electrodes for forming a potential well in the region of said substrate beneath said second electrode;

means for applying a voltage to said third electrode for forming a second potential barrier in said substrate which is higher than said first potential barrier;

a drain region in the substrate for conducting away charge carriers;

a fourth electrode insulated from the substrate located between said drain region and said second electrode;

means responsive to the bias voltage applied to said first electrode for supplying a portion thereof to said fourth electrode for creating a third potential barrier in said substrate which is at least as high as said first potential barrier and lower than said second potential barrier; and means for placing said source electrode at a first voltage level such that charge carriers flow over said first potential barrier into said first potential well, whereby any such carriers which overflow said third potential barrier flow to said drain region, and for then withdrawing from said well that portion of the charge filling the well to a level greater than that of said first potential barrier.

3. A CCD input electrode structure as set forth in claim 2, wherein said means for placing said source electrode at a first voltage level comprises a current source.

4. A CCD input electrode structures as set forth in claim 2, wherein said means responsive to said bias voltage comprises means for creating said third potential barrier at a higher level than said first potential barrier and lower than said second potential barrier.

5. A CCD input electrode structure as set forth in claim 2, wherein said means responsive to said bias potential comprises a voltage divider.

6. In a charge coupled circuit which includes a semiconductor substrate, source electrode means in the substrate, storage electrode means insulated from the substrate, and first gate electrode means insulated from the substrate and located between the storage electrode means and said source electrode means for controlling the flow of charge between the source electrode means and the substrate region beneath the storage electrode means, in combination:

means coupled to said first gate electrode means and to said storage electrode means, including means for applying between said first gate electrode means and said storage electrode means a signal potential which may vary, and means supplying a bias potential, for creating a first potential well beneath the storage electrode means and a shallower second potential well beneath the gate electrode means;

a drain electrode in said substrate;

second gate electrode means insulated from the substrate, this one located between said storage electrode means and said drain electrode for controlling the flow of charge between said first potential well and said drain electrode;

means responsive to said bias potential for creating beneath said second gate electrode means a third potential well somewhat shallower than said second potential well;

means for creating a potential difference between said source electrode means and said storage electrode means, during a first time period, for causing a flow of charge from said source electrode means to said first potential well in an amount independent of said signal potential; and means for changing and potential difference between said storage electrode means and said source electrode means, during a second time period following the first in a sense to return charge from the potential well beneath said storage electrode means to said source electrode means to an extent to leave stored beneath said storage electrode means an amount of charge dependent on said signal potential.

7. In a charge coupled circuit as set forth in claim 6, wherein said means responsive to said bias potential comprises means for applying a fixed percentage of said bias potential to said second gate electrode means.

8. In a charge coupled circuit as set forth in claim 7, said means responsive to said bias potential comprising a voltage divider.

9. In a charge coupled circuit as set forth in claim 6, further including:

a plurality of transfer electrodes insulated from the substrate and adjacent to one another forming together a charge coupled device channel, said electrodes for receiving multiple phase voltages for propagating charge signal, the first of said electrodes being located adjacent to said storage electrode means; and means for maintaining said first transfer electrode at a voltage level for creating in the substrate a fourth potential well which is shallower than said third potential well, during the period said charge is caused to flow into said potential well and the period charge is returned to said source electrode means.

10. A control circuit for a semiconductor signal charge transfer device, having a substrate formed with an input source region which can supply charge via an input first gate region of said substrate to a first transfer site in said substrate in response to applied voltages, which comprises:

storage electrode means adjacent to said first transfer site for controlling the latters potential;

first gate electrode means adjacent to said input first gate region for controlling the latters potential;

first circuit means for applying voltages to said storage electrode means and to said gate electrode means, said first circuit means including means for applying a signal voltage whose value may vary between said storage electrode means and said gate electrode means, for creating a potential well at the first transfer site, and a shallower potential well at said input gate region;

a drain region in said substrate;

a second gate region of said substrate extending between said drain region and said first transfer site;

second gate electrode means adjacent to said second gate region for controlling the latters potential;

second circuit means for applying a bias voltage to said second gate electrode means for creating a shallower potential well at said second gate region than at said first gate region;

third circuit means for applying a charge injecting voltage pulse between said input source and said storage electrode means for a first time period, of an amplitude sufficient for the transport of a predetermined signal-independent charge from said source region to said potential well of said first transfer site and for then removing said pulse, whereby charge tends to return from said first transfer site to said input source region;

means for continuing to apply said signal voltage between said gate electrode means and said storage electrode means during a second time period immediately following said first time period and which outlasts said first time period, for controlling the retransportation of said signal-independent charge from the first transfer site through the gate region back to the input source during said second time period, in accordance with said signal voltage;

a second transfer site in said substrate adjacent to said first transfer site;

transfer electrode means adjacent to said second transfer site for controlling the latters potential; and fourth circuit means for applying a bias voltage to said transfer electrode during said first and second time periods for creating a shallower potential well at said second transfer site than at said second gate region.

11. In an input circuit for a CCD which includes a substrate: an input region in the substrate of opposite conductivity than the substrate; a gate region of the substrate adjacent to the input region; a storage region of the substrate adjacent to the gate region; means including electrodes over said gate and storage regions, a signal source coupled between said electrodes, and a bias voltage source connected to said electrode over said gate region, for producing a shallower potential well in said gate region that in said storage region; and means for filling said potential well beneath said electrode over said storage region comprising means for applying a voltage to said input region for causing the same to emit charge carriers which pass through said shallower well to the potential well in said storage region, the improvement comprising:

means responsive to the voltage applied to said electrode over said gate region for maintaining said input region at a voltage level which is a fixed percentage of that at said electrode over said gate region during the period said potential well of said storage region is being filled.

* * * * *

UNITED STATES PATENT AND TRADEMARK OFFICE
CERTIFICATE OF CORRECTION

PATENT NO. : 4,191,895

DATED : March 4, 1980

INVENTOR(S): Peter Alan Levine et al.

It is certified that error appears in the above-identified patent and that said Letters Patent is hereby corrected as shown below:

Column 1, line 34, "$\frac{1}{8}_1$" should be --$\phi_1$--.

Column 1, line 40, "one" should be --the--.

Column 3, line 5, "FIG. 13" should be --FIG. 3--.

Column 3, line 11, "to" should be --by--.

Column 5, line 39, "and" should be --the--.

Signed and Sealed this

Third Day of June 1980

[SEAL]

Attest:

SIDNEY A. DIAMOND

Attesting Officer

Commissioner of Patents and Trademarks